(12) United States Patent
Mitsutani (10) Patent No.: US 6,476,738 B1
(45) Date of Patent: Nov. 5, 2002

(54) BLOCK INTERLEAVE CIRCUIT (75) Inventor: Naoki Mitsutani, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/467,975

(22) Filed: Dec. 21, 1999

(30) Foreign Application Priority Data

Dec. 21, 1998 (JP) .......................... 10-363279

(51) Int. Cl.[7] ............................... H03M 9/00
(52) U.S. Cl. ..................... 341/100; 341/101
(58) Field of Search ............... 341/100, 101, 341/102; 370/100, 109, 111

(56) References Cited

U.S. PATENT DOCUMENTS

| | | | | |
|---|---|---|---|---|
| 4,520,480 A | * | 5/1985 | Kawai | 370/100 |
| 5,270,714 A | * | 12/1993 | Tanaka et al. | 341/59 |
| 5,442,800 A | * | 8/1995 | Okamura | 395/800 |
| 5,535,220 A | | 7/1996 | Kanno et al. | 371/2.1 |
| 5,648,776 A | * | 7/1997 | Widmer | 341/100 |
| 6,035,427 A | | 3/2000 | Kweon | |

FOREIGN PATENT DOCUMENTS

| | | |
|---|---|---|
| JP | 55-26715 A | 2/1980 |
| JP | 4-168811 | 6/1992 |
| JP | 6-216882 | 8/1994 |
| JP | 7-170201 A | 7/1995 |
| JP | 8-265177 A | 10/1996 |
| JP | 10-13253 A | 1/1998 |
| JP | 10-214486 A | 8/1998 |
| JP | 10-336594 A | 12/1998 |
| JP | 10-308676 A | 11/1999 |

* cited by examiner

Primary Examiner—Peguy JeanPierre
Assistant Examiner—Joseph Lauture
(74) Attorney, Agent, or Firm—Foley & Lardner (57) ABSTRACT By a shift register, n×d bits of data input Din are converted into parallel signals and latched by a register. A shift register is loaded with the parallel signals latched to the register when a data load signal is at high level and converts the loaded parallel signals into serial signals and outputs the serial signals as output data Dout when the data load signal is at low level. Therefore, connection between the register and the shift register is set such that a time-sequential order of the input data Din can be switched and accordingly, block interleaving can be carried out without using storages.

7 Claims, 6 Drawing Sheets

BLOCK INTERLEAVE CIRCUIT

BACKGROUND OF THE INVENTION

1. Field of the Invention

The present invention relates to a block interleave circuit for segmenting a constant amount of data in input data into one block and converting a time-sequential order of the data in the block.

2. Description of the Related Art

In a digital communication system, in order to correct data error caused between a transmitting apparatus and a receiving apparatus, the transmitting apparatus is provided with a circuit for carrying out error correction coding of a transmitted signal and the receiving apparatus is provided with a circuit for decoding a signal which has been subjected to the error correction coding.

Further, the circuit for carrying out error correction coding of the transmitting apparatus is further provided with a block interleave circuit for segmenting n×d pieces of data into one block and converting a time-sequential order of the data in the block for thinning bit errors generated in a burst on a transmission path with a purpose of promoting error correction function. Further, the receiving apparatus for receiving an interleaved signal is provided with a deinterleave circuit for recovering a transmitted signal from the transmitting apparatus in an original time-sequential order.

In respect of an method of carrying out time-sequential conversion of data in a block interleave circuit, there has conventionally been known a system of using a plurality of pieces of storages as described in, for example, Japanese Unexamined Patent Publication No. 6-216882 and Japanese Unexamined Patent Publication No. 4-168811.

Figure 5:
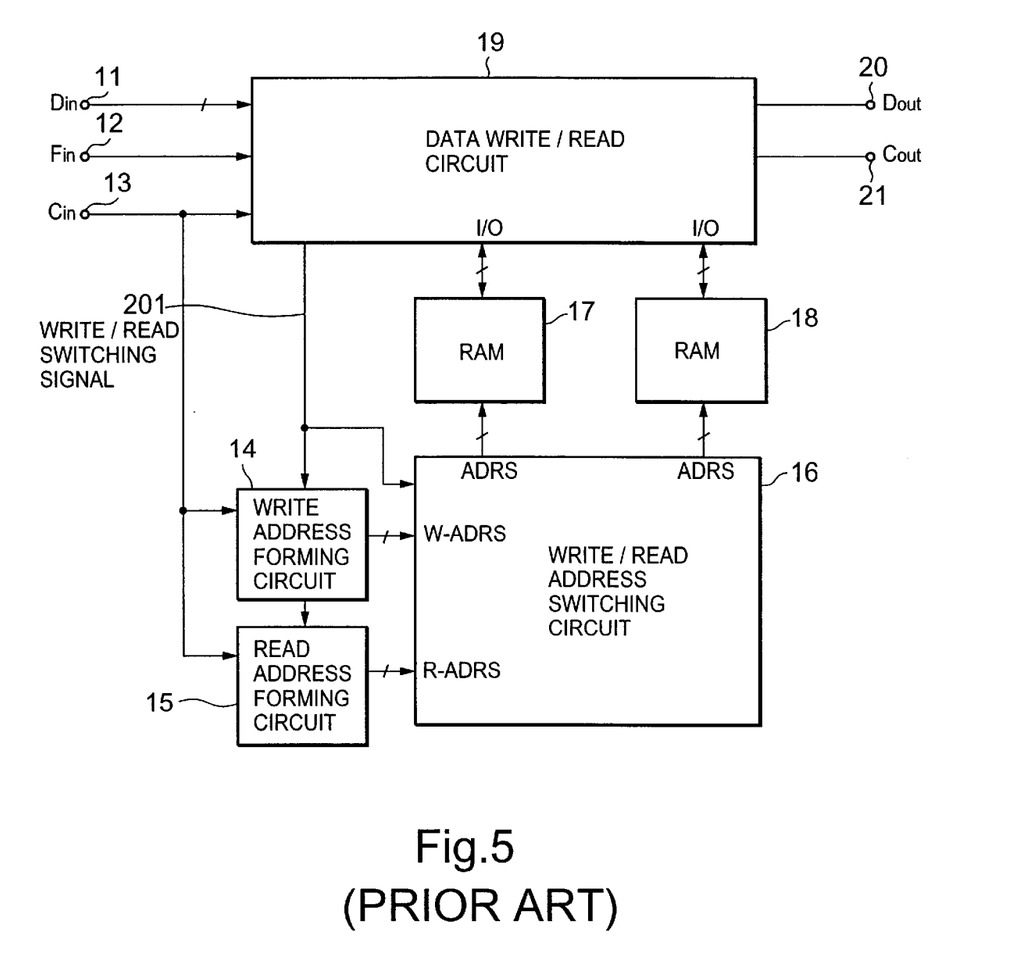
FIG. 5 is a block diagram showing a constitution of a conventional block interleave circuit.

FIG. 5 shows an example of a circuit constitution of such a conventional block interleave circuit. An explanation will be given of a method of time-sequentially converting data in the conventional block interleave circuit in reference to FIG. 5.

The conventional block interleave circuit is constituted by a write address forming circuit 14, a read address forming circuit 15, a write/read address switching circuit 16, RAMs (Random Access Memory) 17 and 18 and a data write/read switching circuit 19.

Input data Din is inputted from a data input terminal 11 and a frame signal Fin is inputted from a frame signal input terminal 12 to the data write/read switching circuit 19 in synchronism with an input clock Cin inputted from a clock input terminal 13. Here, the frame signal Fin is a signal for indicating break of a block of the input data Din.

The data write/read switching circuit 19 generates a write/read switching signal 201 having a unit of n×d pieces of a block and provides the signal to the write address forming circuit 14. The write address forming circuit 14 forms a write address signal to RAM 17 and RAM 18 with the write/read switching signal 201 as a reference. Further, the read address forming circuit 15 is synchronized with the write address forming circuit 14 and generates a read address signal to RAM 17 and RAM 18.

The write/read address switching circuit 16 controls to switch to alternately provide the write address signal from the write address forming circuit 14 and the read address signal from the read address forming circuit 15 to RAM 17 and RAM 18 by using the write/read switching signal 201. At the same time, the data write/read switching circuit 19 controls RAM 17 and RAM 18 to carry out read/write operation of data alternately.

Figure 6A:
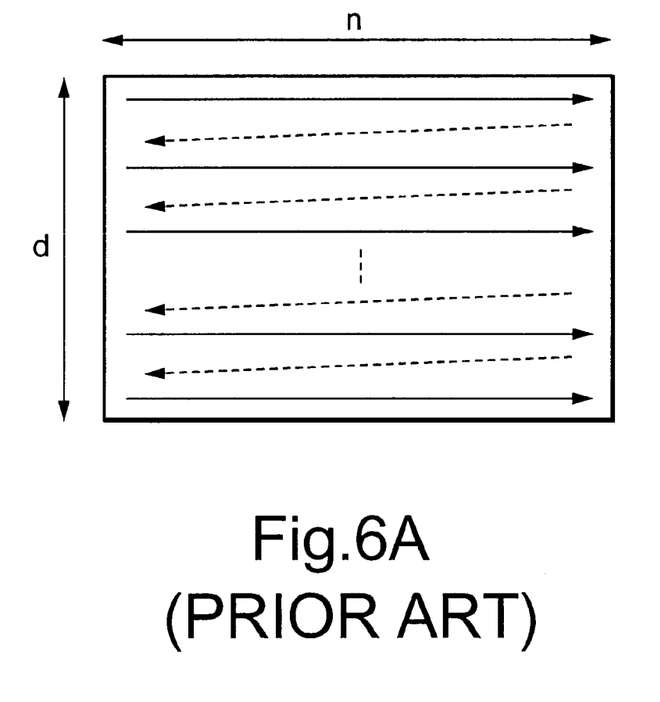
FIG. 6A is a diagram showing write directions of RAM and FIG. 6B is a diagram showing read directions of RAM.
Figure 6B:
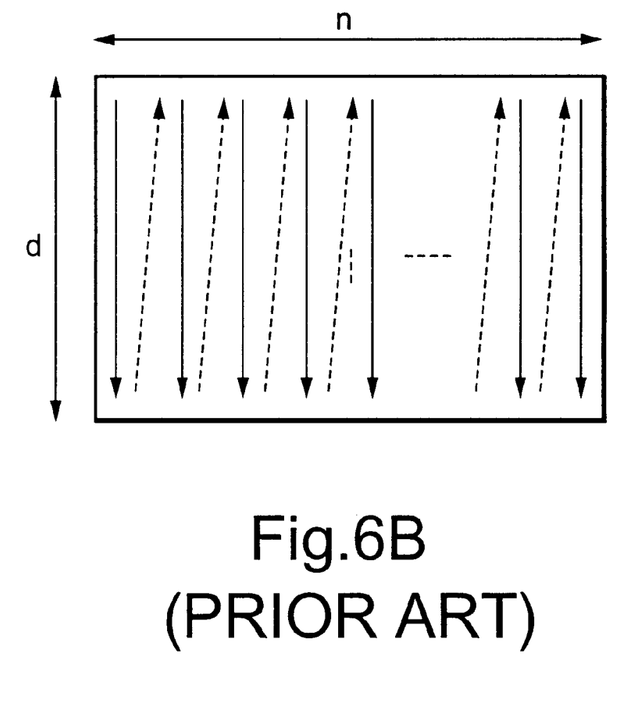

FIG. 6A and FIG. 6B show an outline of operational directions of read/write of RAM 17 and RAM 18. Now, assume that operation of data write is carried out to RAM 17 and operation of data read is carried out to RAM 18. In RAM 17, the data write operation is carried out in directions shown by FIG. 6A and at the same time, the data read operation is carried out in directions shown by FIG. 6B. The write address forming circuit 14 and the read address forming circuit 15 are operated in synchronism with each other by the write/read switching signal 201 and therefore, the write operation and the read operation of RAM 17 and RAM 18 are simultaneously started and finished. Further, successively, the data read operation is carried out in RAM 17 in the directions shown by FIG. 6B and the data write operation is carried out in RAM 18 in the directions shown by FIG. 6A.

By the above-described operation, the time-sequential order of the input data Din inputted from the data input terminal 11 is converted and the input data Din is outputted from a data output terminal 20 as output data Dout.

In this way, two storages (RAM 17, 18) are needed in the conventional interleave circuit and the read write address switching control and the data read write switching control are needed in RAMs 17 and 18. Further, when the data speed is accelerated, high speed RAM is needed to cause an increase in the cost in realizing the circuit.

Further, when data is dealt with by a symbol unit in which 1 symbol is constituted by m bits, although time-sequential conversion of symbol can be realized by the above-described method, in the time-sequential conversion of bits constituting symbols, there are needed a write address forming circuit, a read address forming circuit and two pieces of storages (RAM) for each bit, the circuit scale is magnified and the cost is also increased.

According to the above-described conventional block interleave circuit, interleaving of input data is carried out by using the storages and therefore, there poses a problem in which when data speed is accelerated, high-speed storages are needed and when an amount of data to be converted is increased, a necessary memory amount is increased and therefore, the cost is increased.

SUMMARY OF THE INVENTION

It is an object of the present invention to provide a block interleave circuit capable of carrying out time-sequential conversion of data with no need of complicated control even when data speed is high.

In order to achieve the above-described object, according to an aspect of the present invention, there is provided a block interleave circuit for segmenting a constant amount of data in input data into one block and converting a time-sequential order of data in the block, the block interleave circuit comprising:

serial/parallel conversion means for converting the constant amount of the data in the input data into parallel signals; and parallel/serial conversion means for converting the time-sequential order by inputting the parallel signals generated by the serial/parallel conversion means in a previously set order and successively shifting the parallel signals.

Further, according to another aspect of the present invention, the serial/parallel conversion means comprises:

a frequency dividing circuit for dividing an input clock by using frame signals which are signals indicating segmentation of the block of the input data and outputting a divided clock;

a first shift register comprising data flip flop circuits connected in a vertical column and having a number in correspondence with the constant amount of the data for shifting the input data bit by bit by using the input clock to thereby output a constant amount of data in the input data as parallel data; and a register comprising data flip flop circuits having a number in accordance with the constant amount of data for respectively latching a constant amount of the parallel data outputted from the first shift register by the divided clock from the frequency dividing circuit.

Further, according to another aspect of the present invention, the parallel/serial conversion means comprises:

a data load signal generating circuit for generating a data load signal outputted at a timing at which all of one block of data has been read by delaying the divided clock by one clock by the input clock; and a second shift register comprising:

data flip flop circuits connected in vertical columns and having a number in accordance with the constant amount of data; and a plurality of logical circuits for parallelly loading a constant amount of data latched by the serial/parallel conversion means and storing the constant amount of data to the data flip flop circuits when the data load signal is active and making data stored to the data flip flop circuits shift when the data load signal is inactive.

As has been described, according to the present invention, block interleaving is carried out by converting the input data into the parallel signals by the serial/parallel conversion means, switching the time-sequential order of the input data and thereafter converting the parallel signals into the serial signals by the parallel/serial conversion means as the output data.

Therefore, according to the present invention, the block interleave circuit is constituted only by the shift registers, the register and the logical circuits without using storages and accordingly, high speed formation of data speed can be dealt with and the circuit scale is not significantly magnified even when the data amount is increased.

Further, according to another aspect of the present invention, there is provided a block interleave circuit in which the input data is dealt with as symbols, one of the symbols comprises a plurality of bits and the first and the second shift registers and the registers are provided by a number of the bits of the symbol.

Further, according to another aspect of the present invention, there is provided a block interleave circuit in which connection between the registers and the second shift registers is set at every respective bits.

According to the present invention, in addition to time-sequential conversion of the symbols, even a further complicated time-sequential conversion in which time-sequential conversion of bits is carried out, can be realized by a constitution in which shift registers and registers having a number the same as a number of the bits constituting one symbol are added.

DETAILED DESCRIPTION OF THE PREFERRED EMBODIMENTS

A detailed explanation will be given of embodiments of the present invention in reference to the drawings as follows.

(First Embodiment)

Figure 1:
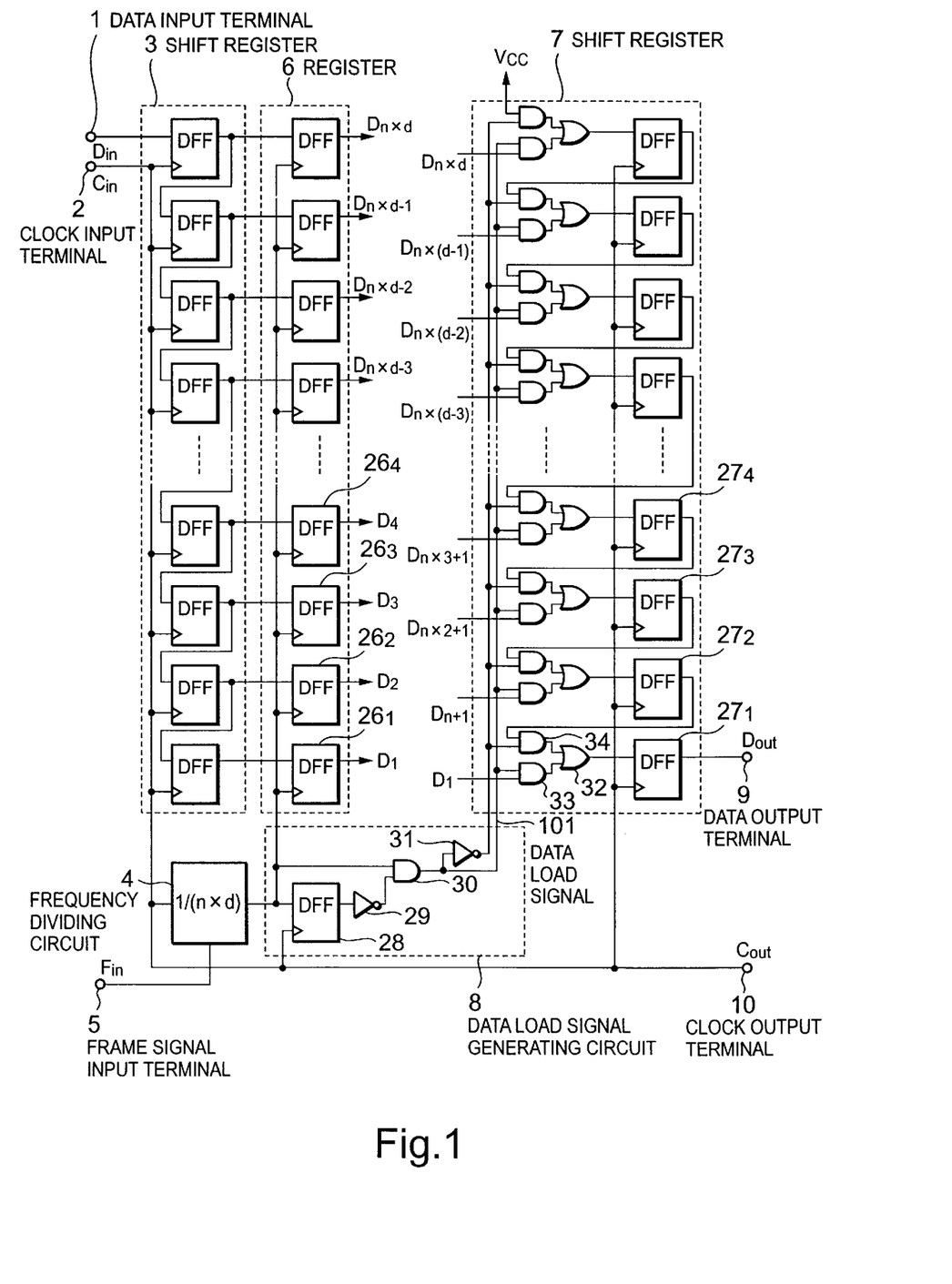
FIG. 1 is a block diagram showing a constitution of a block interleave circuit according to a first embodiment.

FIG. 1 is a block diagram showing a constitution of a block interleave circuit according to a first embodiment of the present invention.

According to the embodiment, data having n×d bits of input data Din of a bit string is segmented into one block and outputted as output data Dout after converting a time-sequential order of data in the block. Input data Din inputted from a data input terminal 1 is in synchronism with input clock Cin inputted from a clock input terminal 2. Further, a frame signal Fin inputted from a frame signal input terminal 5 is also in synchronism with the input clock Cin.

Further, time-sequentially converted data in which a time-sequential order of the input data Din inputted from the data input terminal 1 is rearranged, is outputted from the data output terminal 9 as the output data Dout and output clock Cout in synchronism with the output data Dout is outputted from a clock output terminal 10.

The block interleave circuit according to the embodiment is constituted by a shift register 3, a frequency dividing circuit 4, a register 6, a shift register 7 and a data load signal generating circuit 8.

The frequency dividing circuit 4 divides the input clock Cin inputted from the clock input terminal 2 by 1/(n×d) by using the frame signal Fin and outputs the divided clock as 1/(n×d) divided clock to the register 6 and the data load signal generating circuit 8.

The shift register 3 is constituted by n×d pieces of DFFs (data flip flop circuit) connected in vertical columns and by subjecting the input data Din to bit shift by using the input clock Cin, data of n×d bits in the input data Din is outputted as parallel data of n×d bits to the register 6.

The register 6 is constituted by n×d pieces of DFFs and holds the parallel data of n×d bits outputted from the shift register 3 by respectively latching the parallel data by the 1/(n×d) divided clock from the frequency dividing circuit 4.

Specifically, as shown by FIG. 1, the register 6 includes DFFs $26_1$ through $26_4$ and DFFs $26_1$ through $26_4$ respectively hold $D_1$ through $D_4$ bits of the input data Din.

In this case, the 1/(n×d) divided clock is formed by dividing the input clock Cin by 1/(n×d) and adjustment of timing of dividing by 1/(n×d) is carried out by the frame signal Fin and accordingly, the register 6 carries out latch operation by a unit of n×d bits.

There is constituted a serial/parallel conversion circuit for converting the input data Din inputted from the data input terminal 1 in serial/parallel conversion.

The data load signal generating circuit 8 generates a data load signal 101 of one bit width by delaying the 1/(n×d)

divided clock by one clock based on the input clock Cin. Accordingly, the data load signal 101 is outputted at a timing where all of data of one block has been read and is formed once per n×d bits.

The data load signal generating circuit 8 is constituted by DFF 28, inverting circuits 29 and 31 and an AND circuit 30.

DFF 28 holds one clock of the 1/(n×d) divided clock based on the input clock Cin. The inverting circuit 29 logically inverts an output from the DFF 28 and outputs the inverted signal. The AND circuit 30 carries out AND operation between the 1/(n×d) divided clock and an output from the inverting circuit 29 and outputs a result of the operation as the data load signal 101. The inverting circuit 31 logically inverts the data load signal 101 and outputs the inverted signal.

The shift register 7 is a shift register of a clock-synchronized parallel load type constituted by n×d pieces of DFFs and a plurality of logical gates which are connected in vertical columns. When the data load signal 101 from the data load signal generating circuit 8 is at high level, parallel load of data of n×d bits latched by the register 6 is carried out. When the data load signal 101 is at low level, a parallel/serial conversion is carried out by carrying out shift operation in respect of loaded data and the data is outputted from the data output terminal 9 as the output data Dout.

The plurality of logical gates constituting the shift register 7 select to load n×d bits of data from the register 6 to n×d pieces of DFFs in synchronism with the input clock Cin or successively shift data of n×d pieces of DFFs by the data load signal 101.

Specifically, the shift register 7 includes DFFs $27_1$ through $27_4$ and DFF $27_1$ is provided with AND circuits 33 and 34 and an OR circuit 32 as logical circuits for switching the load operation and the shift operation.

Further, parallel data from the register 6 is not inputted to the shift register 7 in an order as it is but is inputted to the shift register 7 such that a time-sequential order thereof is switched.

When the data load signal 101 is at high level, the AND circuit 33 outputs $D_1$ bits to the OR circuit 32. In this case, a signal outputted from the inverting circuit 31 is at low level and accordingly, an output from the AND circuit 34 is always at low level. Accordingly, the OR circuit 32 outputs data of $D_1$ bits outputted from the AND circuit 33 to DFF $27_1$. The load operation is carried out in this way.

When the data load signal 101 is at low level, the AND circuit 33 always outputs low level to the OR circuit 32. In this case, the signal outputted from the inverting circuit 31 is at high level and therefore, the AND circuit 34 outputs output data from the DFF $27_2$ to the OR circuit 32. Therefore, the OR circuit 32 outputs output data from DFF $27_2$ outputted from the AND circuit 34 to DFF $27_1$. The shift operation is carried out in this way.

A parallel/serial conversion circuit for carrying out parallel/serial conversion in respect of parallel data latched by the register 6 is constituted by the data load signal generating circuit 8 and the shift register 7.

Figure 2:
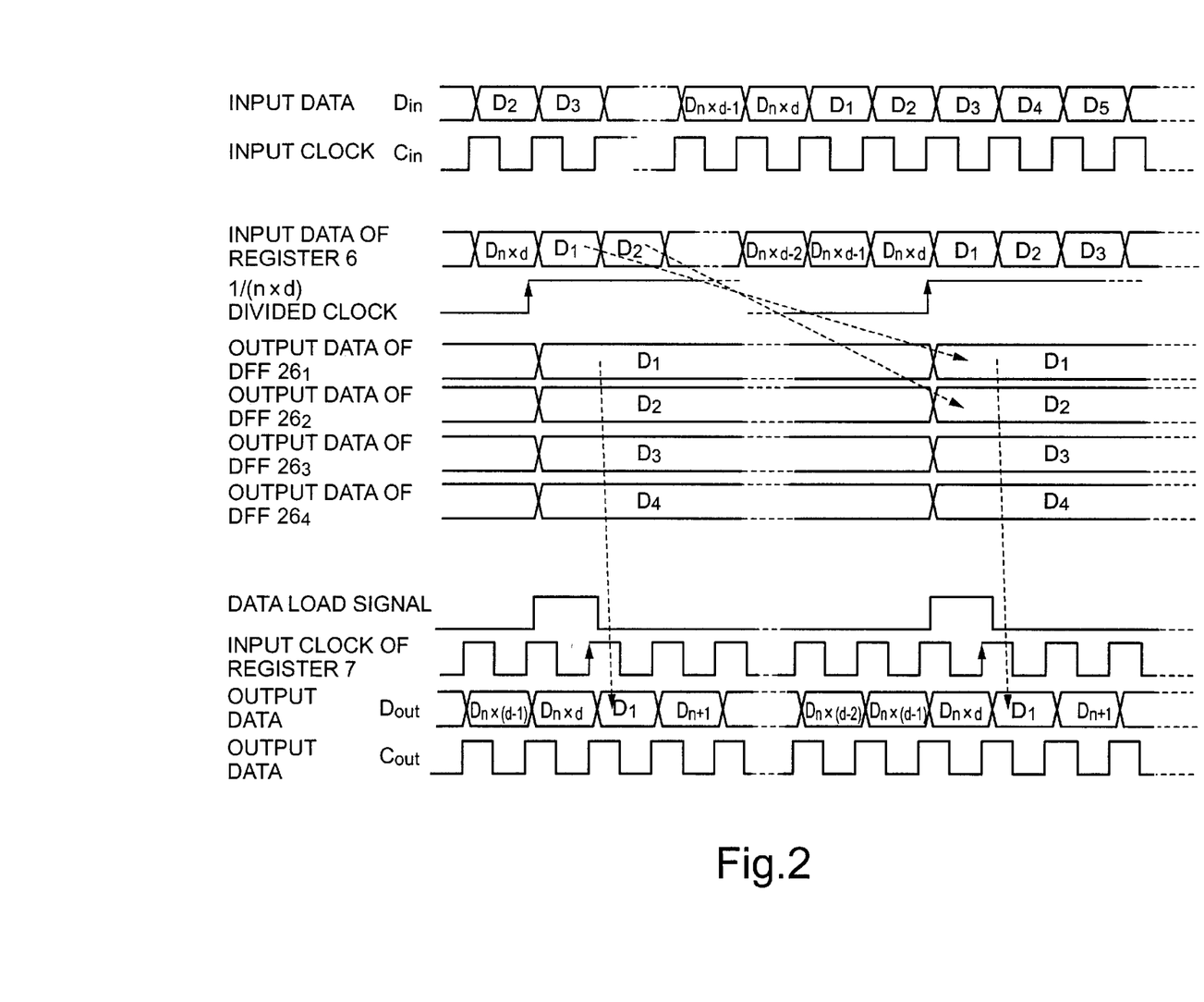
FIG. 2 illustrates timing charts showing operation of the block interleave circuit in FIG. 1.

Next, an explanation will be given of operation of the embodiment shown by FIG. 1 in reference to FIG. 2. FIG. 2 shows a relationship among timings of data in the block interleave circuit of FIG. 1.

First, an explanation will be given of serial/parallel conversion operation of the input data Din in FIG. 1.

The frequency dividing circuit 4 generates the 1/(n×d) divided clock by the clock Cin inputted from the clock input terminal 2 and the frame signal Fin inputted from the frame signal input terminal 5. Further, data inputted from the data input terminal 1 is shifted clock by clock by the clock Cin at the shift register 3 and the output data $D_1$ through $D_{n \times d}$ are latched by the 1/(n×d) divided clock at the register 6 to thereby carry out serial/parallel conversion.

Next, an explanation will be given of parallel/serial conversion operation of data.

The 1/(n×d) divided clock is further converted into the data load signal 101 having 1 bit width by the data load signal generating circuit 8 and thereafter supplied to the shift register 7. In this case, a timing where the data load signal 101 at high level is outputted to the shift register 7, is a timing where n×d bits of data are latched to the register 6 and the time period of constituting the high level is 1 clock of the clock Cin. Therefore, in the shift register 7, by loading data latched to the register 6 at rise of the clock Cin (or clock Dout) at the timing where the data load signal 101 becomes high level, 1 block of data is loaded to the shift register 7.

When the data load signal 101 is at low level, data loaded by the clock Cin when the data load signal 101 is at high level is successively shifted and outputted from the data output terminal 9.

In this case, according to the embodiment, data of n×d bits from the register 6 is inputted to the shift register 7 while switching the time-sequential order at every n bits. Therefore, the time-sequential conversion of data is carried out by inputting data of the register 6 to the shift register 7.

Figure 3A:
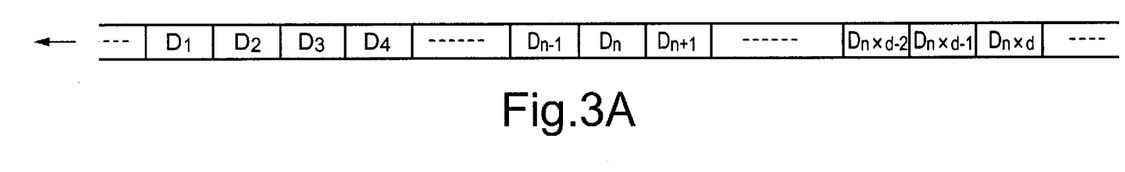
FIGS. 3A, 3B and 3C are outline views of block interleave.
Figure 3B:
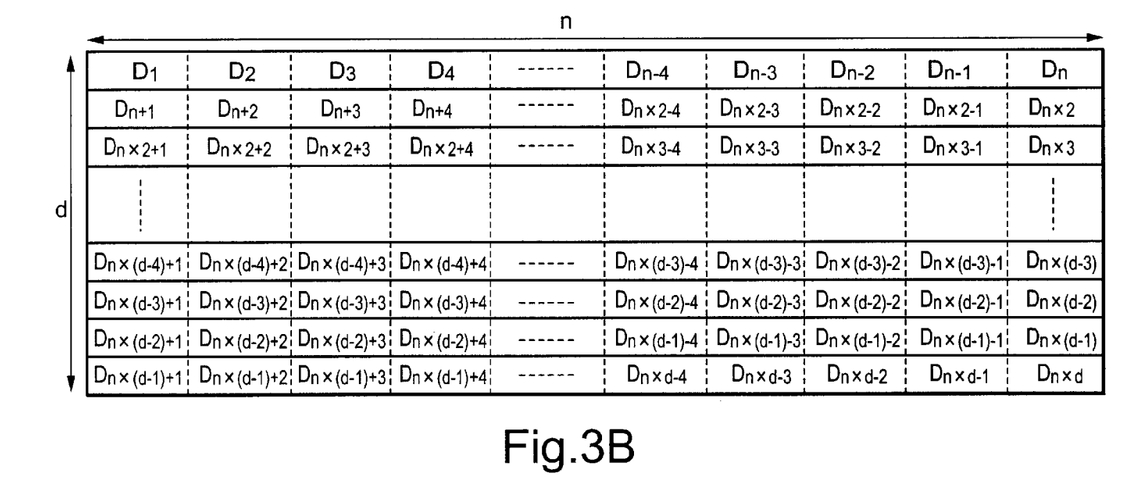
Figure 3C:
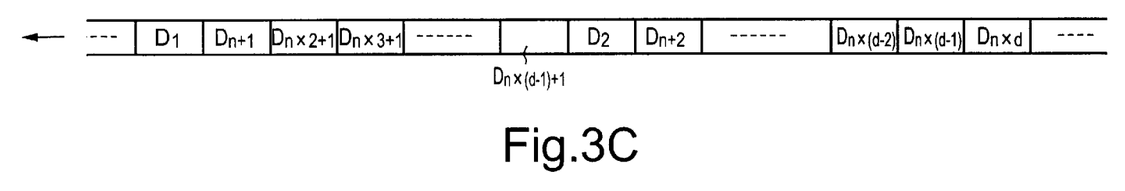

FIGS. 3A, 3B and 3C show an outline of the time-sequential conversion of data according to the embodiment. Time-sequential data $D_1$, $D_2$, $D_3$ . . . before conversion shown by FIG. 3A is segmented into the block unit of n×d bits shown by FIG. 3B and rearranged into an order shown by FIG. 3C by converting the time-sequential order.

As has been explained, according to the embodiment, the time-sequential conversion of data is realized only by subjecting input data to serial/parallel conversion and parallel/serial conversion in synchronism with input clock by the shift registers, the register, the logical gates, the frequency dividing circuit and the load pulse generating circuit.

According to the embodiment, by connecting the register 6 and the shift register 7, the time-sequential order of the input data is converted and therefore, high speed conversion of the time-sequential order of data can be carried out without using storages. Accordingly, even in the case where the data speed is as fast as 100 Mbps or higher, the interleave circuit can be realized by a simple circuit constitution.

Further, according to the embodiment, a plurality of storages (RAM) as in the conventional block interleave circuit are not needed and accordingly, a read/write control circuit having complicated storages is dispensed with.

(Second Embodiment)

Next, an explanation will be given of a block interleave circuit according to a second embodiment of the present invention.

Although according to the above-described first embodiment, the input data Din is constituted by a bit string, the embodiment shows a case of data in which 1 symbol comprises m bits.

Figure 4:
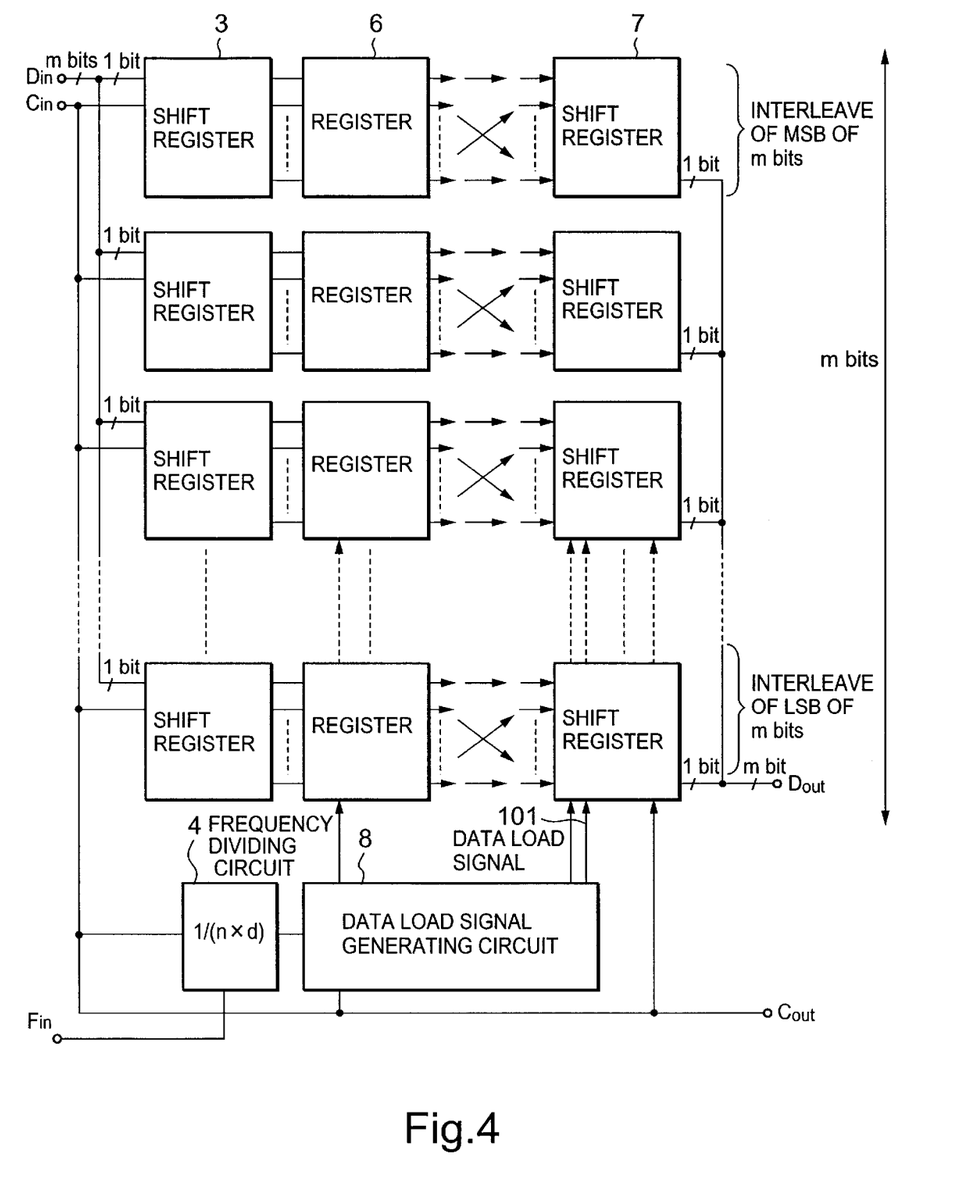
FIG. 4 is a block diagram showing a constitution of a block interleave circuit according to a second embodiment of the present invention.

FIG. 4 shows a block interleave circuit according to the embodiment.

In the drawing, conversion of a time-sequential order of input symbols can be carried out by expanding the shift register 3, the register 6 and the shift register 7 respectively to m of them. In this case, by changing connection between the register 6 and the shift register 7 at every m bits constituting 1 symbol, in addition to conversion of the time-sequential order of the input symbols, conversion of the time-sequential order of the respective bits constituting the symbols can be carried out and a further complicated interleave circuit can be realized.

Although according to the first and the second embodiments, an explanation has been given of the block interleave circuit, a deinterleave circuit can be realized by switching n and d of the input signal of the shift register 7 in FIG. 1. In this case, a signal from a frame synchronizing circuit normally connected successive to the deinterleave circuit may be inputted to the frame signal input terminal 5 as the frame signal Fin.

As has been explained, the present invention achieves the following effects.

(1) Even in the case where the data speed is as high as 100 Mbps or higher, the interleave circuit can be realized by a simple circuit constitution.

(2) A plurality of storages (RAM) are not needed and accordingly, a read/write control circuit having complicated storages is dispensed with.

What is claimed is:

1. A block interleave circuit for segmenting a constant amount of data in input data into one block and converting a time-sequential order of data in the block, said block interleave circuit comprising:

serial/parallel conversion means for converting the constant amount of the data in the input data into parallel signals by using a first shift register and a register; and parallel/serial conversion means for converting the time-sequential order by inputting the parallel signals generated by the serial/parallel conversion means in a previously set order and successively shifting the parallel signals by using a second shift register.

2. The block interleave circuit as claimed in claim 1:

wherein the serial/parallel conversion means comprises:
a frequency dividing circuit for dividing an input clock by using frame signals which are signals indicating segmentation of the block of the input data and outputting a divided clock;

the first shift register comprising data flip flop circuits connected in a vertical column and having a number in correspondence with the constant amount of the data for shifting the input data bit by bit by using the input clock to thereby output a constant amount of data in the input data as parallel data; and the register comprising data flip flop circuits having a number in accordance with the constant amount of data for respectively latching a constant amount of the parallel data outputted from the first shift register by the divided clock from the frequency dividing circuit.

3. The block interleave circuit as claimed in claim 1:

wherein the parallel/serial conversion means comprises:
a data load signal generating circuit for generating a data load signal outputted at a timing at which all of one block of data has been read by delaying a divided clock by one clock of an input clock; and the second shift register comprising;
data flip flop circuits connected in vertical columns and having a number in accordance with the constant amount of data; and
a plurality of logical circuits comprising AND and OR circuits for parallelly loading the constant amount of data converted by the serial/parallel conversion means and storing the constant amount of data in the data flip flop circuits when the data load signal is active and shifting data stored in the data flip flop circuits when the data load signal is inactive.

4. The block interleave circuit as claimed in claim 3:

wherein the data load signal generating circuit comprises:
a data flip flop circuit for holding one clock of the divided clock based on the input clock;
a data flip flop circuit for holding one clock of the divided clock based on the input clock;
a first inverting circuit for logically inverting and outputting an output from the data flip flop circuit;
an AND circuit for carrying out an AND operation between the divided clock and an output from the first inverting circuit and outputting a result of the operation as the data load signal; and
a second inverting circuit for logically inverting and outputting the data load signal.

5. The block interleave circuit as claimed in claim 4:

wherein the input data is dealt with as symbols, one of the symbols comprises a plurality of bits and. the first and the second shift registers and the register are provided a number of the bits of the symbol.

6. The block interleave circuit as claimed in claim 3:

wherein the input data is dealt with as symbols, one of the symbols comprises a plurality of bits and the first and the second shift registers and the register are provided a number of the bits of the symbol.

7. The block interleave circuit as claimed in claim 6:

wherein connection between the register and the second shift register is set at every respective number of the bits.

* * * * *